United States Patent
Hiramatsu (10) Patent No.: US 8,212,470 B2
(45) Date of Patent: Jul. 3, 2012

(54) LUMINESCENT MATERIAL

(75) Inventor: Ryosuke Hiramatsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 12/883,676

(22) Filed: Sep. 16, 2010

(65) Prior Publication Data

US 2011/0215709 A1 Sep. 8, 2011

(30) Foreign Application Priority Data

Mar. 3, 2010 (JP) ................................ 2010-046982

(51) Int. Cl.
*H01J 63/04* (2006.01)

(52) U.S. Cl. .................. 313/503; 252/301.4 F (58) Field of Classification Search .......... 313/501–503; 252/301.4 F, 301.4 H
See application file for complete search history.

(56) References Cited

U.S. PATENT DOCUMENTS

2009/0014881 A1* 1/2009 Endo et al. .................. 257/758
2009/0153582 A1* 6/2009 Hajjar et al. ................. 345/592
2010/0001637 A1* 1/2010 Satou ............................ 313/504
2010/0051974 A1* 3/2010 Krames ......................... 257/89

FOREIGN PATENT DOCUMENTS

JP 2003-101081 4/2003

OTHER PUBLICATIONS

U.S. Appl. No. 13/033,086, filed Feb. 23, 2011, Hiramatsu.

* cited by examiner

*Primary Examiner* — Toan Ton
*Assistant Examiner* — Brenitra Lee
(74) *Attorney, Agent, or Firm* — Oblon, Spivak, McClelland, Maier & Neustadt, L.L.P.

(57) ABSTRACT

According to one embodiment, a luminescent material includes luminescent material particles having a composition represented by formula A.

$$(Mg_{1-w}AE_w)_a(Ge_{1-x}Sn_x)_bO_cCl_d:zMn \quad A$$

where AE is at least one selected from Ca and Sr, and $3.5 \leq a \leq 4.4$, $0.8 \leq b \leq 1.1$, $5.5 \leq c \leq 7.0$, $0 < d \leq 0.41$, $0 < w \leq 0.05$, $0 < x \leq 0.10$, and $0 < z \leq 0.03$.

20 Claims, 9 Drawing Sheets

LUMINESCENT MATERIAL

CROSS-REFERENCE TO RELATED APPLICATIONS

This application is based upon and claims the benefit of priority from Japanese Patent Application No. 2010-046982, filed Mar. 3, 2010; the entire contents of which are incorporated herein by reference.

FIELD

Embodiments described herein relates generally to a luminescent material and a light-emitting device.

BACKGROUND

A light-emitting diode (LED) is composed of a combination of an LED chip as an excitatory light source with a luminescent material and emits various luminescent colors depending on the combination. An LED chip which emits light in the ultraviolet to blue region and a luminescent material are used for a white LED light-emitting device which emits white light. For example, a combination of an LED chip which emits blue light with a mixture of luminescent materials is listed. As a luminescent material, it is common to use a luminescent material which emits light of yellow which is a complementary color of blue. A combination of an LED chip which emits blue light with a yellow luminescent material is called a pseudo-white LED light-emitting device. In addition to the device, a three-wavelength white LED light-emitting device formed by combining an LED chip which emits blue light and a luminescent material mixture containing a green luminescent material or a yellow luminescent material and a red luminescent material has been developed. However, when such a light-emitting device is used for illumination and backlight of a display, characteristics such as color rendering which shows the visibility of an object and color gamut showing a high hue value are insufficient. One of the causes of reduction of characteristics is that the emissive efficiency of a red luminescent material, particularly a deep red luminescent material which shows a deep red color is insufficient when using light in the ultraviolet to blue region as excitatory light.

As one of deep red luminescent materials, $3.5MgO \cdot 0.5MgF_2 \cdot GeO_2:Mn$ is known. For example, a white LED light-emitting device formed by combining a luminescent material mixture containing this luminescent material and a yttrium aluminum garnet (YAG) yellow luminescent material and a blue semiconductor light-emitting element is proposed in JP-A 2003-101081 (KOKAI). It is required that the luminescent material used for the white LED light-emitting device well absorbs the emission wavelength of the LED chip (i.e., an excitatory light source) and efficiently emits visible light. However, when the deep red luminescent materials are used, sufficient emissive efficiency is not obtained by excitatory light, particularly in a blue region and thus the emissive intensity is low. Therefore, there is also a problem in brightness of the white light-emitting device.

DETAILED DESCRIPTION

In general, according to one embodiment, a luminescent material includes luminescent material particles having a composition represented by formula A.

$$(Mg_{1-w},AE_w)_a(Ge_{1-x},Sn_x)_bO_c,Cl_d:zMn \qquad A$$

where AE is at least one selected from Ca and Sr, a, b, c, d, w, x and z respectively satisfies

$3.5 < a \leq 4.4$, $0.8 \leq b \leq 1.1$, $5.5 \leq c \leq 7.0$,
$0 < d \leq 0.41$, $0 < w \leq 0.05$, $0 < x \leq 0.10$, and
$0 < z \leq 0.03$.

Hereinafter, the embodiments will be explained. The embodiments described below are examples of the luminescent materials and the light-emitting devices each embodying the technical concept of the present invention, so that the present invention should not be construed as being limited to the following embodiments.

Further, the members described in the claims accompanied herewith should not be construed as being limited to those described in the following embodiments. The sizes, specific materials, configurations and arrangement of the components described in the following embodiments are set forth merely for the purpose of explanation and hence should not be construed as limiting the scope of the present invention. In this regard, the size and relative position of the members shown in the drawings are exaggerated in some cases for the convenience of explanation. Further, the same or similar members are identified by the same designation or the same reference numbers, thereby omitting the repetition of detailed explanation thereof. As for each element which constitutes the embodiments, a plurality of elements may be constituted by one member and the plurality of elements may be shared by this member. In reverse, the function of one element may be shared by a plurality of members.

As a result of studies and research, the present inventors have discovered a red luminescent material whose emissive intensity is greater than that of a $3.5MgO \cdot 0.5MgF_2 \cdot GeO_2:Mn$ red luminescent material which is already known as a red luminescent material which emits light in response to excitatory light in the blue region.

The luminescent material according to one embodiment contains a main crystal phase and manganese (Mn) as an activator and has a composition represented by the following Formula A:

$(Mg_{1-w},AE_w)_a(Ge_{1-x},Sn_x)_bO_cCl_d:zMn$   A where AE is at least one selected from Ca and Sr, a, b, c, d, w, x and z respectively satisfies
$3.5 \leq a \leq 4.4$, $0.8 \leq b \leq 1.1$, $5.5 \leq c \leq 7.0$,
$0 < d \leq 0.41$, $0 < w \leq 0.05$, $0 < x \leq 0.10$, and
$0 < z \leq 0.03$.

When any one of them is outside its respective range, the emissive efficiency of the luminescent material deteriorates.

The value of a is preferably 3.9 to 4.2, that of b preferably 0.9 to 1.0, that of c preferably 5.6 to 6.9, and that of d preferably 0.40 or less.

Since the luminescent material according to one embodiment contains Mn as an activator, z in Formula A should be greater than zero. When Mn is not contained (z=0), an emission (spectrum) is not obtained even when excited by light having an emission peak in the ultraviolet to blue region. However, an excessive content of Mn causes a concentration-quenching phenomenon and thus the emissive intensity of the luminescent material to be obtained becomes weak. In order to avoid this, the upper limit of z is confined to 0.03.

A main crystal phase of the luminescent material of one embodiment has a structure in which an octahedral $MgO_6$ structure is connected by an octahedral $GeO_6$ structure and a tetrahedral $GeO_4$ structure as a fundamental crystal structure. The fact that Mn (i.e., an activator) substitutes main crystal phases such as an octahedral (Mg,AE) site and an octahedral (Ge,Sn) site is estimated from an emission spectrum originating from $Mn^{4+}$. However, it is difficult to accurately determine the amount of Mn substituting each site. Mn (i.e., an activator) is specified as a ratio to a material which constitutes the main crystal phase.

The content of each of these elements in the luminescent material according to one embodiment can be analyzed, for example, by the following procedures. In the analysis of a metal element such as Mg, Ca, Sr, Ge, Sn, or Mn, the synthesized luminescent material is subjected to alkali fusion. The fused material obtained is analyzed by ICP emission spectroscopy which is an internal standard method using, for example, an SPS 4000 (manufactured by SII Nanotechnology, Inc.).

In the analysis of non-metal element "0", the synthesized luminescent material is first subjected to inert gas fusion. The fused material is analyzed by infrared absorption using, for example, a TC-600 (manufactured by Leco Co., Ltd.). In order to analyze Cl, the luminescent material synthesized is first subjected to thermal hydrolysis. The resultant product is analyzed by ion chromatography using, for example, a DX-120 (manufactured by Nippon Dionex K.K.). In this manner, the composition of the luminescent material is determined.

The luminescent material of one embodiment should contain Sn and Cl together with AE which is at least either Ca or Sr. If any one of AE, Sn and Cl is missed, the luminescent material to be obtained does not emit light at a sufficient intensity when excited by light having an emission peak in the ultraviolet to blue wavelength region.

As for a luminescent material having an excessive content of at least one of these elements, the emissive intensity is decreased when excited by light having an emission peak in the ultraviolet to blue wavelength region. When the amount of elements such as AE, Sn and Cl is too large, it is estimated that a fundamental crystal structure and a crystalline surrounding $Mn^{4+}$ cannot be maintained. Thus, the upper limits of w, x and d in Formula A are set to 0.05, 0.10 and 0.41, respectively. Such findings were found by the present inventors for the first time.

When Ca is contained as AE, w is preferably 0.04 or less and d is preferably 0.25 or less. Based on a difference between the crystal structure and the ionic radius, the reason is considered as follows. The ionic radius of a $Sr^{2+}$ ion is larger than that of $Ca^{2+}$ and $Mg^{2+}$ ions. A $Cl^-$ ion is contained in the fundamental crystal structure of the composition represented by Formula A. The ionic radius of the $Cl^-$ ion is larger than that of $Sn^{4+}$ and $O^{2-}$ ions. The ionic radius of these $Sn^{4+}$ and $O^{2-}$ ions is larger than that of a $Ge^{4+}$ ion. Thus, it is assumed that the composition range containing Sn and Cl is increased by containing the $Sr^{2+}$ ion with a larger ionic radius than that of the $Ca^{2+}$ ion.

Even if the element contained as AE is either Sr or Ca, w is preferably 0.03 or more and x is preferably 0.08 or more. When each element is contained within the ranges above, this case has the advantage that a sufficient emissive intensity is obtained.

A crystal phase of the luminescent material represented by Formula A can be identified by the following procedures. First, the diffraction pattern is measured by powder X-ray diffractometry (XRD). Then, the diffraction patterns obtained are compared with Joint Committee on Powder Diffraction Standards (JCPDS) cards, thereby performing the identification of the crystal phase.

The diffraction peak to be obtained by the XRD measurement corresponds to a plurality of diffraction peaks of JCPDS cards. The corresponding peaks are the diffraction peaks similar to those of orthorhombic system $Mg_{3.5}Ge_{1.25-x}O_6F_{4-x}$ phase shown in the JCPDS card #23-1225, orthorhombic system $Mg_{3.5}Ge_{1.25}O_6$ phase shown in the JCPDS card #23-1227 and orthorhombic system $Mg_5GeO_6F_2$ phase shown in the JCPDS card #28-617. There is no JCPDS card having the composition identical to that of the luminescent material represented by Formula A. For this reason, it is assumed that a plurality of diffraction peaks correspond to the composition. In the luminescent material of the embodiments, a part of the constituent elements of the compound as already reported is substituted by an element having a large ionic radius. This is why the composition is not identical to that of the existing JCPDS cards.

The luminescent material of one embodiment has the composition represented by Formula A. However, to be exact, Mg and Ge sites are not completely substituted by AE and Sn. It is assumed that some of them invade between lattices and defective sites are produced. Similarly, it is assumed that Cl invades between lattices while substituting a part of the O site. In the case of a red luminescent material of $3.5MgO \cdot 0.5MgF_2 \cdot GeO_2:Mn$, it has been reported that a part of the cation site forms defective sites. As evidenced by the XRD diffraction pattern, the luminescent material according to the embodiment has a similar crystal structure to that of $3.5MgO \cdot 0.5MgF_2 \cdot GeO_2:Mn$. Thus, it is assumed that the same phenomenon is produced.

When the luminescent material according to the embodiment is excited by light having an emission peak in an ultraviolet to blue wavelength region (250 to 490 nm), the obtained emission spectrum has a main emission peak exhibiting a half band width of 20 nm in a wavelength region of 650 to 665 nm. For example, a near-ultraviolet region LED having an emission peak of 400 nm and a blue region LED having an emission peak of 460 nm can be used for the excitation of the luminescent material and a spectrophotometer is used for the measurement. As the spectrophotometer, for example, IMUC-7000G (manufactured by Otsuka Electronics Co., Ltd.) can be used.

The term "main emission peak" means a wavelength at which the peak intensity of the emission spectrum becomes maximum. The variation of emission peak of around 10 nm because of the addition of a small amount of an element or because of a slight fluctuation in composition at the time of manufacturing the luminescent material may be regarded as being the main emission peak that has been reported so far.

The light-emitting device according to one embodiment can be obtained by combining the luminescent material according to one embodiment with a light-emitting element having an emission peak in the ultraviolet to blue wavelength region. Based on the excitation spectrum whose main emission peak is detected, the lower limit of the wavelength to be used for the excitation of the luminescent material of one embodiment is confined to 250 nm. On the other hand, when excited at a wavelength greater than 490 nm, the luminescent material according to one embodiment hardly emits light. Thus, the upper limit of the excitation wavelength is confined to 490 nm. When excited at a wavelength of 420 nm or more, an emissive intensity higher than that of the existing red luminescent material such as $3.5MgO.0.5MgF_2.GeO_2:Mn$ can be obtained.

The luminescent material according to one embodiment can be manufactured by the following method. The oxide powder, chloride powder or carbonate compound powder of the constituent elements can be employed as raw materials. The raw materials of the constituent elements are weighed to obtain predetermined amounts thereof and mixed together by, for example, a ball mill. If necessary, a crystal growth-promoting agent may be added.

For example, $MnCO_3$, $Mn_2O_3$, $MnO_2$ and $MnCl_2$ can be used as a source of Mn. As a source of Mg, basic magnesium carbonate ($mMgCO_3.Mg(OH)_2.nH_2O$), MgO and $MgCl_2$ can be used. For example, $CaCO_3$, CaO, $CaCl_2$, $CaCl_2.2H_2O$ and $CaCl_2.4H_2O$ can be used as a source of Ca. For example, $SrCO_3$, SrO, $SrCl_2$ and $SrCl_2.6H_2O$ can be used as a source of Sr. For example, $GeO_2$ is listed as a source of Ge. For example, $SnO_2$ can be used as a source of Sn.

Raw material powders such as oxide, carbonate and chloride are formulated in conformity with the composition ratio to be targeted. When mixing raw material powders, it is possible to use either a dry mixing method in which no solvent is employed or a wet mixing method in which an organic solvent such as ethanol is employed.

A source of Cl can be used as a crystal growth-promoting agent. When sintering at high temperatures to synthesize the luminescent material, vaporization is produced. Taking into consideration this situation, chloride of ammonium such as ammonium chloride is usually used as a source of Cl. Additionally, chloride of alkali metal or chloride of alkaline earth metal may be used as a source of Cl. In order to prevent a deviation from the target composition, the additive amount of the crystal growth-promoting agent is preferably from about 0.01 to 0.3% by weight of the total raw material powders. Chloride of alkali metal or alkaline earth metal may be dissolved in the luminescent material or may react with other raw materials to form a different phase. In order to avoid this, it is desirable to set the additive amount of chloride of alkali metal or alkaline earth metal to 0.1% by weight of the total raw material powders.

A mixed raw material obtained by mixing the raw material powders described above is placed in a sintering vessel such as a crucible and then subjected to heat treatment to obtain a sintered product. The heat treatment is performed in an air, $N_2$ or Ar atmosphere. The heat-treatment in such atmospheres allows for the prevention of vaporization of a Cl element and moisture absorption of raw materials as well as the promotion of synthesis of the luminescent material. Even if $Cl_2$ and HCl gases are mixed and used, the same effect is obtained. However, this causes high costs on the heat and exhaust-gas treatment facilities. From this point of view, the treatment is performed in an air, $N_2$ or Ar atmosphere.

The temperature and time of heat treatment can be set in the ranges of 1000 to 1400° C. and 0.5 to 10 hours, respectively. When the sintering temperature is too low, the raw material remains unreacted and the emissive intensity of the luminescent material is decreased. If the sintering time is too short, the emissive intensity of the luminescent material is decreased for the same reason. If the sintering temperature is too high, a disadvantage such as fusion of a raw material or a product or vaporization of a part of the mixed raw material may be caused. Further, when the sintering time is too long, a similar disadvantage may be caused.

The sintered product obtained is pulverized and is again placed in the vessel, which is subjected to secondary sintering in an air, $N_2$ or Ar atmosphere. The pulverization before the secondary sintering is not particularly specified. The lumps of the primary sintered product may be pulverized with a mortar so as to increase the surface area thereof. In the secondary sintering, the crystal growth-promoting agent such as chloride can also be added. The luminescent material of one embodiment is obtained by pulverizing and sieving the secondary sintered product. If necessary, the obtained luminescent material may be subjected to any appropriate post-treatment, such as washing with pure water on the occasion of applying the luminescent material to a light-emitting device.

A surface layer formed of an organic or inorganic material may be formed on the luminescent material particles of one embodiment. The surface layer is effective in preventing the luminescent material from deteriorating because of external factors such as moisture, heat, humidity and ultraviolet rays. Additionally, the dispersibility of the luminescent material can be controlled and thus a luminescent layer can be easily designed.

The material to be used for the formation of the surface layer is selected from the group consisting of, for example, silicone resin, epoxy resin, fluororesin, tetraethoxy silane (TEOS), silica, zinc silicate, aluminum silicate, calcium polyphosphate, silicone oil and silicone grease. Zinc silicate and aluminium silicate are represented by, for example, $ZnO.cSiO_2(1 \leq c \leq 4)$ and $Al_2O_3.dSiO_2(1 \leq d \leq 10)$, respectively. Such materials may be used alone or in combination of two or more kinds.

The surface layer can be provided on the luminescent material particles using a dispersion liquid or a solution. The particles are immersed in the dispersion liquid or the solution for a predetermined period of time and then dried by heating to form a surface layer. The luminescent material particles need not be completely covered with the surface layer. Thus, a part of luminescent material particles may be exposed. As long as the surface layer is present on the luminescent material particles at a rate of 0.1% by volume or more, the effects thereof are obtained. In order not to deteriorate the inherent function of the luminescent material, the rate of the surface layer is preferably confined to about 5% by volume based on the luminescent material particles.

The particle diameter of the luminescent material according to one embodiment is classified depending on the light-emitting device and the coating method to be applied. A usual white LED formed by using excitatory light having an emission peak in the ultraviolet to blue region is classified to an average particle diameter of about 5 to 50 μm by sieving and used. If the average particle diameter of the luminescent material is too small, such as 1 μm or less, the rate of the outermost surface of the non-emissive layer may be increased or the excitatory light may be diffusely reflected. Thus, the emissive intensity is decreased. On the other hand, if the average particle diameter of the luminescent material is too large, a coating device is clogged with the luminescent material when forming an emissive layer. This results in a reduction in operating efficiency and yield as well as color unevenness of the light-emitting device. If the luminescent material having an average particle diameter of about 5 to 50 μm is used, such disadvantages can be avoided.

As described above, emission having a main emission peak originating from $Mn^{4+}$ and exhibiting a half band width of 20 nm in a wavelength region of 650 to 665 nm is obtained by exciting the luminescent material according to one embodiment by light having an emission peak in the ultraviolet to blue region. A light-emitting device which is high in efficiency and in color rendering is obtained by combining the luminescent material of one embodiment with a light-emitting element having an emission peak in the ultraviolet to blue region. A solid state light source element such as an LED chip or a laser diode may be used as a light-emitting element.

The color of emission of the luminescent material according to the embodiment ranges from red to deep red. Therefore, the use thereof in combination with a blue luminescent material, a green luminescent material or a yellow luminescent material allows for the production of a white light-emitting device. The luminescent material to be used may be modified depending on the applications of the light-emitting device. For example, if a light source in the blue wavelength region (420 to 490 nm) is used, a white light-emitting device is obtained by combining with the yellow luminescent material as well as the luminescent material of the embodiments. A white light-emitting device compatible with efficiency and color rendering and having a low color temperature is obtained by combining with the yellow luminescent material.

It can be said that a green or yellow luminescent material is a luminescent material having a main emission peak in a wavelength ranging from 500 to 580 nm. Examples thereof include silicate luminescent materials such as $(Sr,Ca,Ba)_2SiO_4$:Eu and $Ca_3(Sc,Mg)_2Si_3O_{12}$:Ce; aluminate luminescent materials such as $(Y,Gd)_3(Al,Ga)_5O_{12}$:Ce and $BaMgAl_{10}O_{17}$:Eu, Mn; sulfide luminescent materials such as $(Ca,Sr,Ba)Ga_2S_4$:Eu; and alkaline earth oxynitride luminescent materials such as $(Ca,Sr,Ba)Si_2O_2N_2$:Eu and $(Ca,Sr)$-αSiAlON.

When a light source in an ultraviolet to near-ultraviolet wavelength region (380 to 440 nm) is used, it is preferable to use the blue luminescent material together with the green luminescent material and yellow luminescent material described above. It can be said that the blue luminescent material is a luminescent material having a main emission peak in a wavelength ranging from 440 to 500 nm. Examples thereof include halophosphate luminescent materials such as $(Sr,Ca,Ba,Mg)_5(PO_4)_3(Cl,Br)$:Eu and $(Sr,Ca,Ba,Mg)_5(PO_4)_3Cl$:Eu; phosphate luminescent materials such as $2SrO.0.84P_2O_5.0.16B_2O_3$:Eu; and alkaline earth metal aluminate luminescent materials such as $BaMgAl_{10}O_{17}$:Eu.

In addition to the luminescent material described above, luminescent materials which emit blue-green, orange or red light may be used depending on the applications thereof.

Examples of orange or red luminescent materials include silicate luminescent materials such as $(Sr,Ca,Ba)_2SiO_4$:Eu; tungstate luminescent materials such as $Li(Eu,Sm)W_2O_8$; oxysulfide luminescent materials such as $(La,Gd,Y)_2O_2S$:Eu; sulfide luminescent materials such as $(Ca,Sr,Ba)S$:Eu; and nitride luminescent materials such as $(Sr,Ba,Ca)_2Si_5N_8$:Eu and $(Sr,Ca)AlSiN_3$:Eu.

The use of the luminescent material according to the embodiments with those luminescent materials allows for the improvement not only efficiency but also color rendering for the use of illumination. Further, the color gamut for the use of backlight is extended. Since the emission color of the luminescent material according to the embodiments ranges from red to deep red, the effects may be decreased when combined with the luminescent material having a main emission peak wavelength in a long wavelength region. In order to avoid this, it is desirable to combine with the luminescent material having a main emission peak wavelength of 640 nm or less.

Hereinafter, the light-emitting device according to the embodiments will be explained with reference to the drawings.

Figure 1:
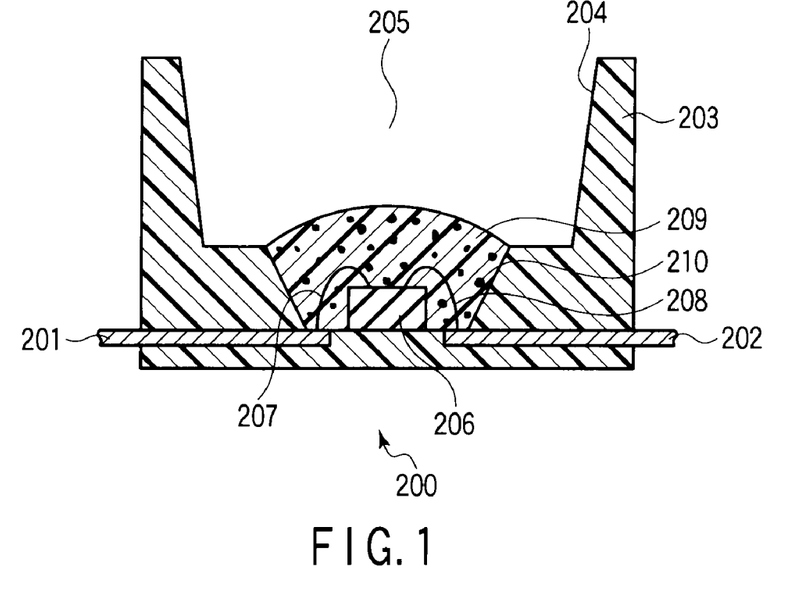
FIG. 1 is a cross-sectional view of a light-emitting device according to one embodiment.

In the light-emitting device shown in FIG. 1, a resin stem 200 includes leads 201 and 202 constituting a lead frame and a resin portion 203 which is formed integral with the lead frame. The resin portion 203 includes a recess 205 having an upper portion wider than the bottom thereof. The sidewall of the recess serves as a reflective surface 204.

A light-emitting element 206 is mounted on a central portion of the approximately circular bottom of the recess 205 by an Ag paste. The light-emitting element 206 emits light having an emission peak in a wavelength ranging from 250 to 490 nm. For example, it is possible to employ a GaAs- or a GaN-based LED as the light-emitting element 206. The electrodes (not shown) of the light-emitting element 206 are connected, through bonding wires 207 and 208 made of Au and the like, with leads 201 and 202, respectively. In this regard, the arrangement of these leads 201 and 202 may be optionally modified.

An emissive layer 209 that contains a luminescent material 210 according to one embodiment is disposed in the recess 205 of the resin portion 203. The emissive layer 209 is formed by dispersing the luminescent material in a resin layer made of, for example, silicone resin at a content ranging from 5 to 50% by weight. The luminescent material can be fixed near the light-emitting element 206 by various binders, for example, an organic material such as a resin or an inorganic material such as glass.

As the binder formed of an organic material, it is suitable to use a transparent resin which is highly light-proof, such as an epoxy resin or an acrylic resin, in addition to the above-described silicone resin. As the binder formed of an inorganic material, it is suitable to use a low-melting glass in which alkaline earth borate is employed; an ultra-fine powder of silica or alumina for enabling the luminescent material of a large particle diameter to be adhered; or an alkaline earth phosphate that can be obtained by sedimentation. These binders may be used alone or in combination of two or more kinds.

As the light-emitting element 206, it is also possible to employ a flip-chip structure in which an n- and a p-type electrode are disposed on the same surface thereof. In this case, it is possible to overcome the problems associated with wiring, such as the cut-off or peeling of wire and the absorption of light by the wire, thereby allowing for the production of a light-emitting device which is excellent in reliability and luminance. The following structure can be fabricated using the light-emitting element having an n-type substrate. An n-type electrode is formed on the bottom surface of the n-type substrate of the light-emitting element and a p-type electrode is formed on the top surface of the semiconductor layer laminated on the substrate. The n-type electrode is mounted on the lead and the p-type electrode is connected with the other lead by wire.

The size of the light-emitting element 206 as well as the size and configuration of the recess 205 may be appropriately modified.

Figure 2:
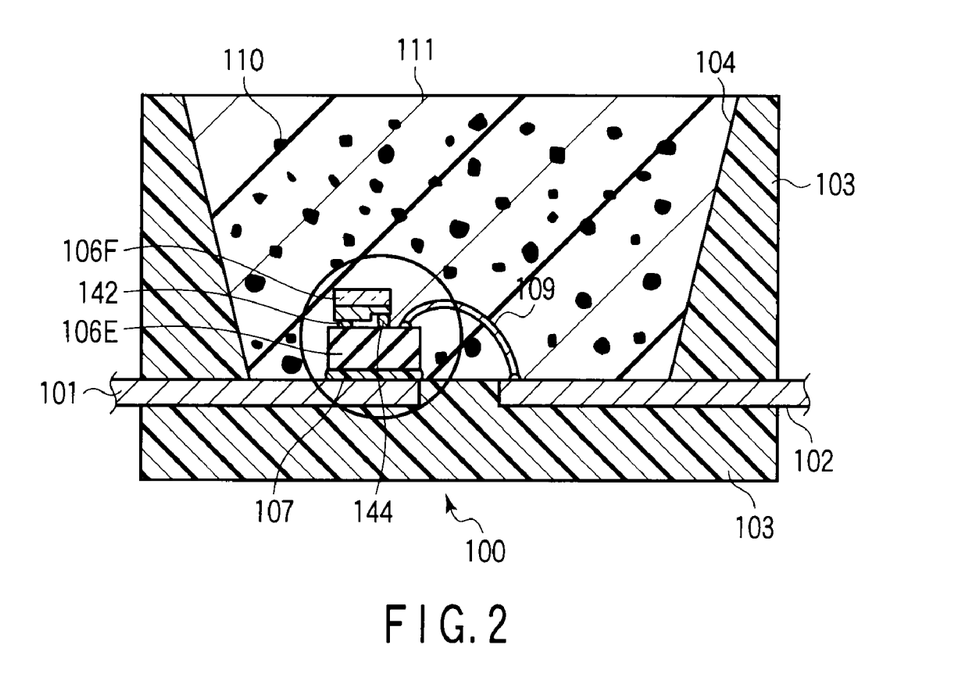
FIG. 2 is a cross-sectional view of a light-emitting device according to another embodiment.

The light-emitting device shown in FIG. 2 includes a sealing resin stem 100, a light-emitting element 106F mounted on the sealing resin stem 100 and an emissive layer 111 covering the light-emitting element 106F. The sealing resin stem 100 has leads 101 and 102 constituting a lead frame and a resin portion 103 which is formed integral with the lead frame. Leads 101 and 102 are disposed in a manner such that one end of each of the leads faces close to the other. The other end of each of leads 101 and 102 is extended in a direction opposite to the other and protruded out of the resin portion 103.

An opening is provided in the resin portion 103. On the bottom of the opening, a protective Zener diode 106E is mounted on lead 101 by an adhesive 107. The light-emitting element 106F is mounted on the diode 106E and the diode 106E is connected with lead 102 by a wire 109. The light-emitting element 106F emits light having an emission peak in a wavelength ranging from 250 to 490 nm.

The light-emitting element 106F is surrounded by the inner walls of the resin portion 103. The inner walls are inclined, thereby enabling them to act as a reflective surface 104 for reflecting light. The emissive layer 111 filled in the opening contains a luminescent material 110 according to one embodiment.

Figure 3:
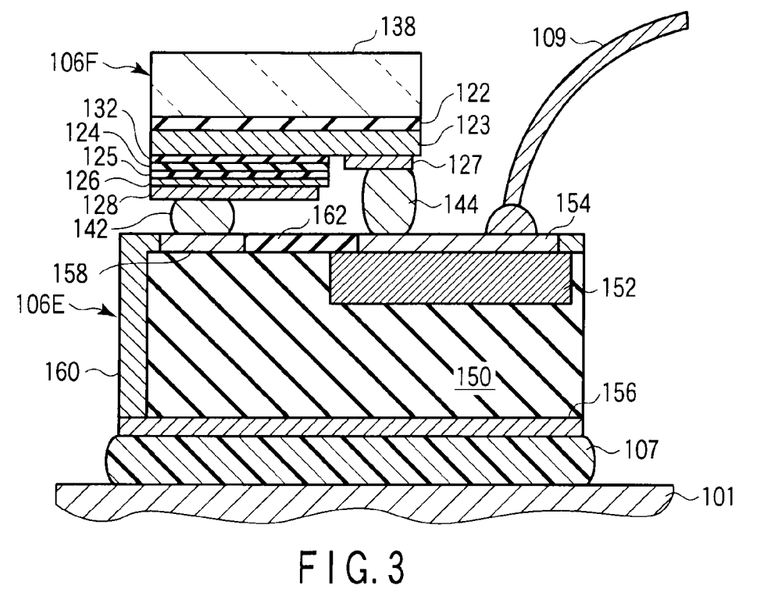
FIG. 3 is an enlarged view of a light-emitting element.

Subsequently, the peripheral portion of the light-emitting element of the light-emitting device will be explained in detail. As shown in FIG. 3, the protective Zener diode 106E is a planar structure in which a p-type region 152 is formed on the top surface of an n-type silicon substrate 150. A p-side electrode 154 is formed in the p-type region 152 and an n-side electrode 156 is formed on the bottom surface of the substrate 150. In reverse to the n-side electrode 156, an n-side electrode 158 is formed on the top surface of the diode 106E. These two n-side electrodes 156 and 158 are connected with each other through a wiring layer 160 which is provided on the sidewall of the diode 106E. Further, a high reflection film 162 is formed on the top surface of the diode 106E on which the p-side electrode 154 and the n-side electrode 158 are provided. The high reflection film 162 exhibits a high reflectance to the light to be emitted from the light-emitting element 106F.

In the light-emitting element 106F, a buffer layer 122, an n-type contact layer 123, an n-type clad layer 132, an active layer 124, a p-type clad layer 125 and a p-type contact layer 126 are sequentially laminated on a translucent substrate 138. Further, an n-side electrode 127 is formed on the n-type contact layer 123 and a p-side electrode 128 is formed on the p-type contact layer 126. The light emitted from the active layer 124 is taken up through the translucent substrate 138.

As illustrated, the light-emitting element 106F is flip-chip-mounted by a bump on the diode 106E. Specifically, the p-side electrode 128 of the light-emitting element 106F is electrically connected through a bump 142 with the n-side electrode 158 of the diode 106E. Further, the n-side electrode 127 of the light-emitting element 106F is electrically connected through a bump 144 with the p-side electrode 154 of the diode 106E. A wire 109 is bonded to the p-side electrode 154 of the diode 106E. As explained with reference to FIG. 2, the wire 109 is connected with lead 102.

When emitting light having an emission peak in a wavelength ranging from 250 to 490 nm, the structure of the light-emitting element 106F may be appropriately modified.

Figure 4:
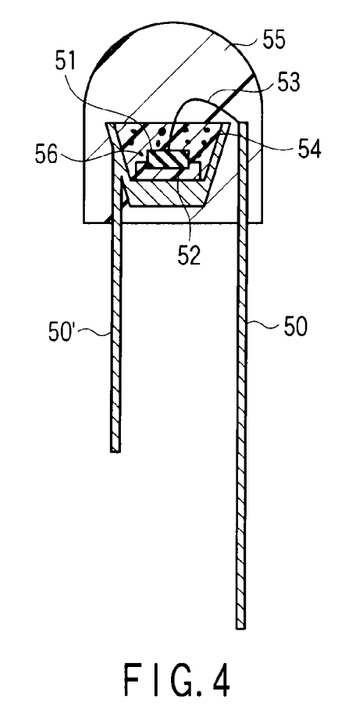
FIG. 4 is a cross-sectional view of a light-emitting device according to another embodiment.

In a shell-type light-emitting device shown in FIG. 4, a light-emitting element 51 is mounted, through a mounting material 52, on a lead 50'. The light-emitting element 51 emits light having an emission peak in a wavelength ranging from 250 to 490 nm and is covered with a pre-dipping material 54 of an emissive layer. A luminescent material 56 according to the embodiments is contained in the emissive layer. A lead 50 is connected with the light-emitting element 51 by a wire 53 and sealed with a casting material 55.

In the light-emitting device having any structure, an emissive layer containing the luminescent material according to one embodiment is provided so as to receive a light having a wavelength ranging from 250 to 490 nm emitted from a light-emitting element. Thus, a light-emitting device which is high in efficiency and in color rendering is obtained.

The light-emitting device according to one embodiment, for example, a white LED is suitably used as an ordinary illumination. Further, the light-emitting device is most suitable for use as a luminescence device where a filter such as a color filter is used in combination with a light source, for example, as a light source for the backlight of a liquid crystal device. Specifically, the light-emitting device can be used as a light source for the backlight of the liquid crystal display or as a red luminescent material of an inorganic electroluminescence device formed by using a blue emissive layer.

Hereinafter, Examples and Comparative Examples are shown. The present invention is not limited to the following examples unless departing from the spirit of the invention.

EXAMPLE 1

As raw material powders, 34.2 g of basic magnesium carbonate powder, 2.0 g of $MgCl_2$ powder, 2.0 g of $CaCO_3$ powder, 9.6 g of $GeO_2$ powder, 1.5 g of $SnO_2$ powder and 1.8 g of $MnO_2$ powder were prepared. These raw material powders were uniformly mixed in a ball mill. The mixed powders thus obtained were placed in a crucible. The crucible was disposed in a furnace and sintered in an air atmosphere at a temperature ranging from 1000 to 1400° C. for 0.5 to 8 hours to obtain a primary sintered product.

The obtained primary sintered product was pulverized and an aqueous solution containing 0.1% by weight of $NH_4Cl$ was added thereto as a crystal growth-promoting agent, which was placed again in the crucible. The crucible was disposed in the furnace and sintered in an air atmosphere at a temperature ranging from 800 to 1200° C. for 0.5 to 8 hours to obtain a secondary sintered product. The secondary sintered product was pulverized and then sieved to obtain a luminescent material of Example 1.

As a result of quantitative analysis thereof, it was confirmed that the composition of the luminescent material of Example 1 was $(Mg_{0.96},Ca_{0.04})_{3.9}(Ge_{0.90},Sn_{0.10})_{1.0}O_{6.2}, Cl_{0.15}:0.02Mn$.

Namely, as for the luminescent material of Example 1, a, b, c, d, w, x and z in Formula A have the following respective values:

a=3.9, b=1.0, c=6.2, d=0.15,
w=0.04, x=0.10, z=0.02

The obtained luminescent material was observed with a fluorescence microscope. For example, ECLIPSE80i (manufactured by Nikon Corporation) can be used for the microscopic observation. In addition to the form of particles of the luminescent material, the emission of the luminescent material was observed by excitatory light in the region of 365, 435 and 450 nm. From the result of the fluorescence microscope observation, it was confirmed that the luminescent material of the example had a columnar or needle-like form having a relatively large aspect ratio and was particles having a particle diameter of about 5 to 30 μm. Further, it was confirmed that the luminescent material uniformly emitted red light by the irradiation with excitatory light in the region of 365 to 450 nm. The crystal configuration varies depending on the raw material to be used, the sintering temperature, the time and the crystal growth-promoting agent. In the luminescent material of the example, particles having a square form as if the middle of the columnar or needle-like form is broken or particles having a corner-rounded configuration were also confirmed.

Further, the obtained luminescent material was excited by a blue LED having an emission peak wavelength of 460 nm and the emission spectrum was measured. The result is shown as the curve a1 in FIG. 5. The curve a1 shows that an emission spectrum originating from $Mn^{4+}$ and exhibiting a half band width of 18 nm and a main emission peak in a wavelength of 657 nm was obtained from the luminescent material of Example 1.

A commercially available luminescent material of $3.5MgO.0.5MgF_2.GeO_2$:Mn was prepared as Comparative Example 1. The luminescent material was excited by the same blue LED as described above and the emission spectrum was measured. The result is shown as the curve a0 in FIG. 5. The curve a0 shows that an emission spectrum originating from $Mn^{4+}$ and exhibiting a half band width of 18 nm and a main emission peak in a wavelength of 657 nm was obtained from the luminescent material of Comparative Example 1 as with the luminescent material of Example 1. However, the emissive intensity of the luminescent material of Comparative Example 1 is inferior to that of the luminescent material of Example 1. Specifically, the emissive intensity of the luminescent material of Example 1 was 1.35 times higher than that of the luminescent material of Comparative Example 1.

Figure 5:
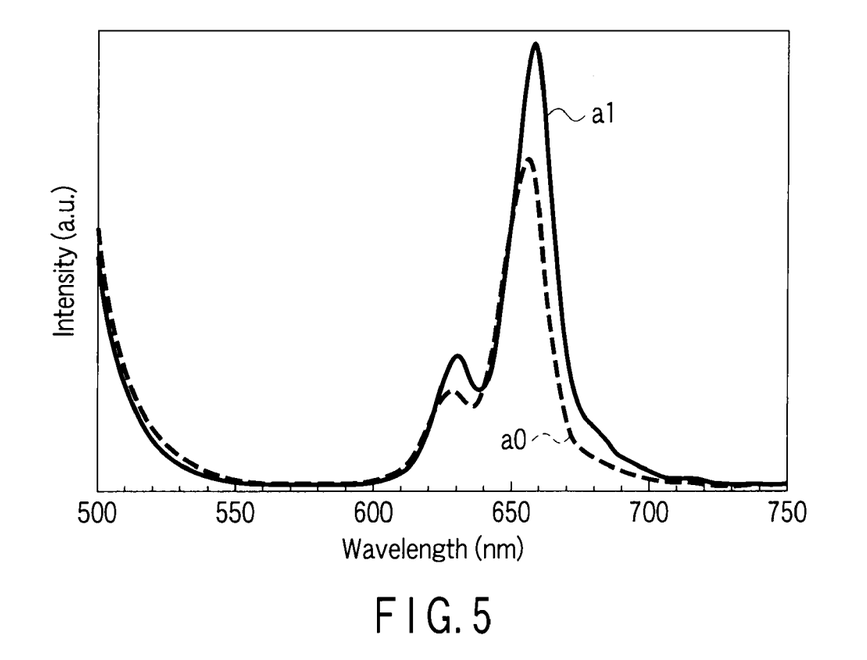
FIG. 5 is an emission spectrum of a luminescent material according to one embodiment.

In this regard, a peak appeared around 500 nm in FIG. 5 in response to excitatory light.

When the excitation spectrum of the luminescent material of Example 1 was measured, it was confirmed that an excitation band existed around 250 to 490 nm. The excitation spectrum can be given by measuring powders of the luminescent material by the diffusion scattering method using, for example, the FluoroMax-4 spectrophotofluorometer (manufactured by Horiba Ltd.).

Figure 6:
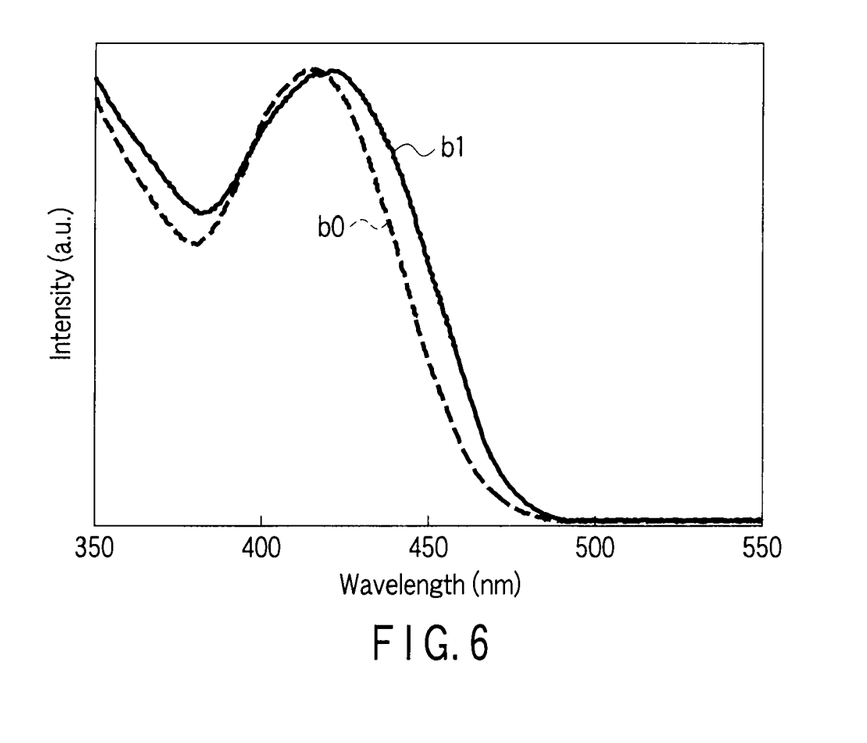
FIG. 6 is an excitation spectrum of the luminescent material according to one embodiment.

The excitation spectrum in the near-ultraviolet to blue wavelength region obtained from the luminescent material of Example 1 is shown as the curve b1 in FIG. 6. The curve b1 is the excitation spectrum obtained by observing the amount of emission of the main emission peak wavelength of 657 nm. The luminescent material of Comparative Example 1 was excited in the same manner as described above. The obtained excitation spectrum is also shown as the curve b0 in FIG. 6. As shown in FIG. 6, the peak wavelength of the excitation spectrum (b1) of the luminescent material of Example 1 is shifted to a long wavelength side by approximately 5 nm as compared with that of the excitation spectrum (b0) of the luminescent material of Comparative Example 1. It was found that a higher emissive intensity than that of the commercial luminescent material was obtained in the wavelength region of around 420 to 480 nm.

When excited by the blue LED having a wavelength of 460 nm, the emissive intensity of the luminescent material of Example 1 is higher than that of the luminescent material of Comparative Example 1. This is shown as the curve a1 in FIG. 5. The result of FIG. 6 agrees with this result. An excitation mechanism originating from $Mn^{4+}$ is generally explained by the $^4A_2 \rightarrow {}^4T_2$ transition or the $^4A_2 \rightarrow {}^4T_1$ transition. The excitation spectrum in the region of around 380 to 490 nm shown in FIG. 6 corresponds to the $^4A_2 \rightarrow {}^4T_2$ transition. It is known that the $^4A_2 \rightarrow {}^4T_2$ transition sensitively shifts in the crystal field surrounding the $Mn^{4+}$ activator. The luminescent material of Example 1 contains Ca, Sn and Cl having a larger ionic radius than that of Mg, Ge and O. For this reason, it is assumed that the influence of the crystal field surrounding the $Mn^{4+}$ activator became smaller than that of the luminescent material of Comparative Example 1 and the excitation wavelength peak was shifted to the long wavelength side.

When the spectrum was normalized by the excitation spectrum peak associated with the $^4A_2 \rightarrow {}^4T_2$ transition in order to find the peak position of the spectrum, almost the same spectrum as that of FIG. 6 was obtained.

Further, the formulation was changed as described below and luminescent materials of Comparative Examples 2 to 5 were synthesized. Then, the luminescent materials were excited by the light in the ultraviolet to blue wavelength region in the same manner as described above. With respect to each luminescent material, the excitation spectrum was determined by monitoring the emission peak wavelength in the excited state.

A luminescent material of Comparative Example 2 was synthesized in the same manner as described in Example 1 except that $MgCl_2$ powder, $CaCO_3$ powder and $NH_4Cl$ as a crystal growth-promoting agent were not used. Ca and Cl are not added to the luminescent material of Comparative Example 2. Therefore, the luminescent material of Comparative Example 2 has the composition of d=0 and w=0 in Formula A.

Figure 7:
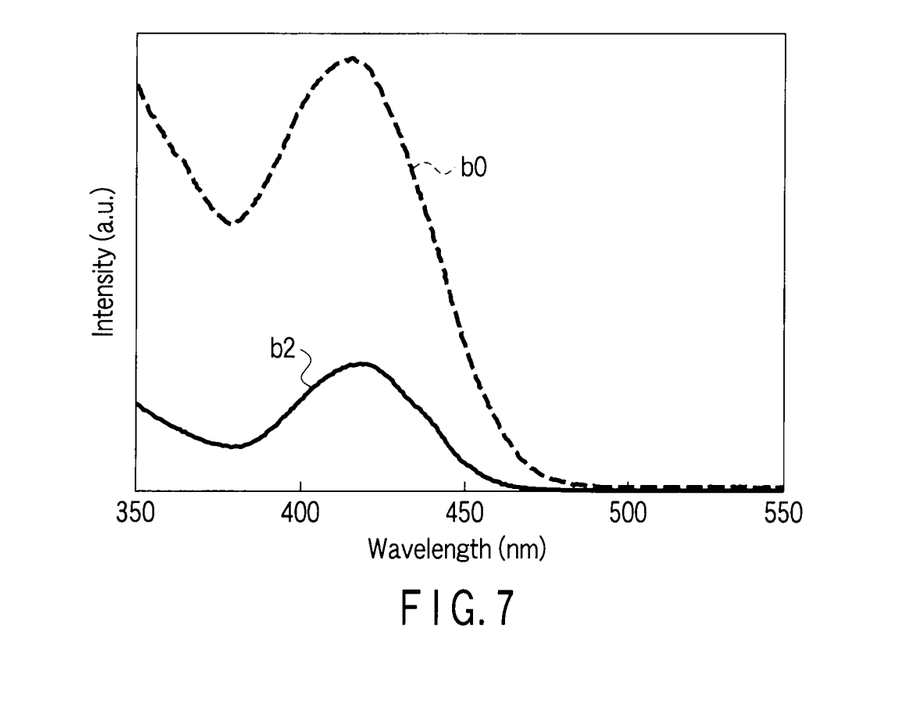
FIG. 7 is an excitation spectrum of a luminescent material of a Comparative Example.

The excitation spectrum of the luminescent material of Comparative Example 2 is shown as the curve b2 in FIG. 7. The excitation spectrum of the luminescent material of Comparative Example 1 is also shown as the curve b0 in FIG. 7. The excitation spectra normalized by the excitation spectrum peak associated with the $^4A_2 \rightarrow {}^4T_2$ transition as for Comparative Examples 1 and 2 are shown as the curves c0 and c2, respectively, in FIG. 8. The peak position of the spectrum in each of the luminescent materials can be found from the normalized excitation spectrum.

Figure 8:
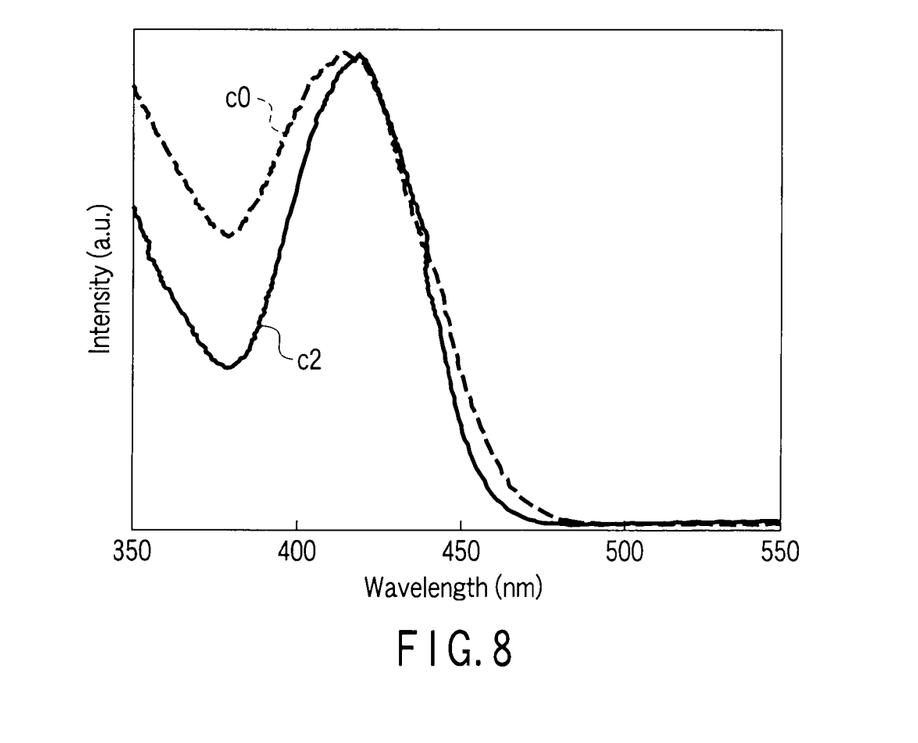
FIG. 8 is a normalized excitation spectrum.

As shown in FIG. 7, the excitation spectrum in the wavelength region of around 420 to 480 nm of the luminescent material having the composition of d=0 and w=0 in Formula A becomes lower than that of the commercial luminescent material. Further, the normalized excitation spectrum in FIG. 8 shows that a long wavelength shift of a peak wavelength is not clearly confirmed.

A luminescent material of Comparative Example 3 was synthesized in the same manner as described in Example 1 except that $CaCO_3$ powder and $SnO_2$ powder were not used. Ca and Sn are not contained in the luminescent material of Comparative Example 3. Therefore, the luminescent material of Comparative Example 3 has the composition of w=0 and x=0 in Formula A.

Figure 9:
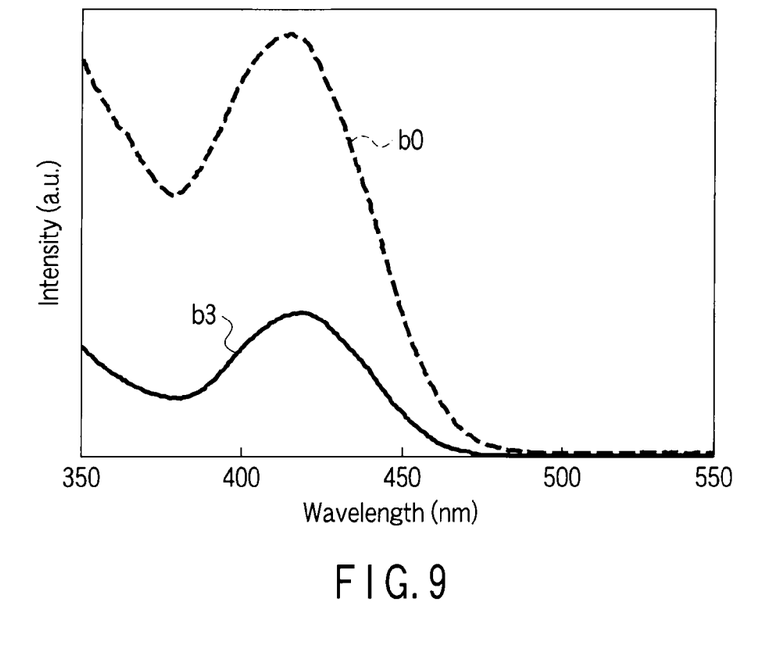
FIG. 9 is an excitation spectrum of a luminescent material of a Comparative Example.

The excitation spectrum of the luminescent material of Comparative Example 3 is shown as the curve b3 in FIG. 9. The excitation spectrum of the luminescent material of Comparative Example 1 is also shown as the curve b0 in FIG. 9. Further, the excitation spectra normalized by the excitation spectrum peak associated with the $^4A_2 \rightarrow {}^4T_2$ transition as for Comparative Examples 1 and 3 are shown as the curves c0 and c3, respectively, in FIG. 10.

Figure 10:
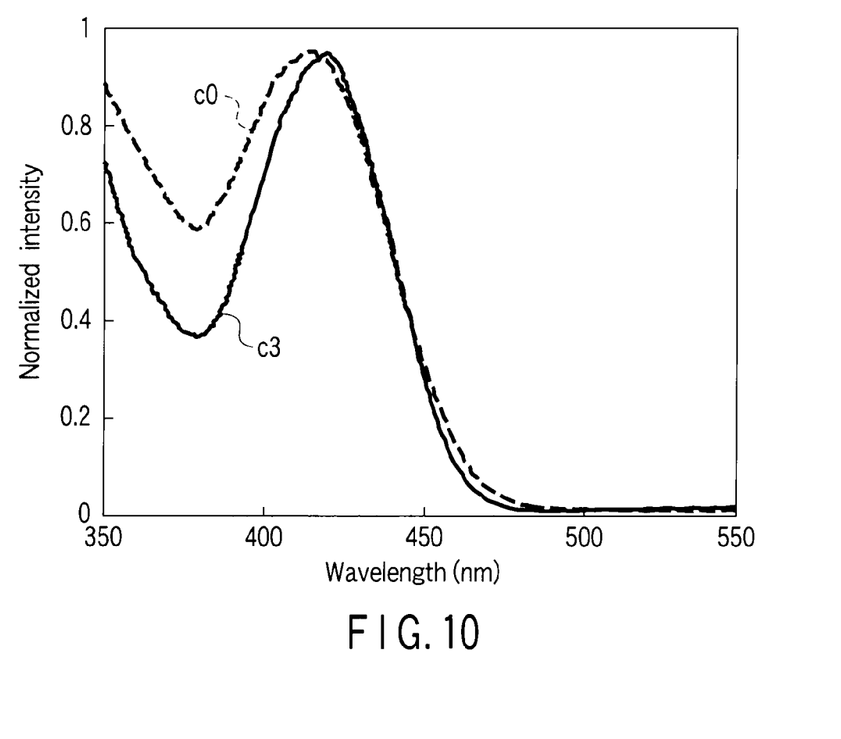
FIG. 10 is a normalized excitation spectrum.

As shown in FIG. 9, the excitation spectrum in the wavelength region of around 420 to 480 nm of the luminescent material having the composition of w=0 and x=0 in Formula A becomes lower than that of the commercial luminescent material. Further, the normalized excitation spectrum in FIG. 10 shows that a long wavelength shift of a peak wavelength is not clearly confirmed.

A luminescent material of Comparative Example 4 was synthesized in the same manner as described in Example 1 except that $CaCO_3$ powder was not used. Ca is not added to the luminescent material of Comparative Example 4. Therefore, the luminescent material of Comparative Example 4 has the composition of w=0 in Formula A.

Figure 11:
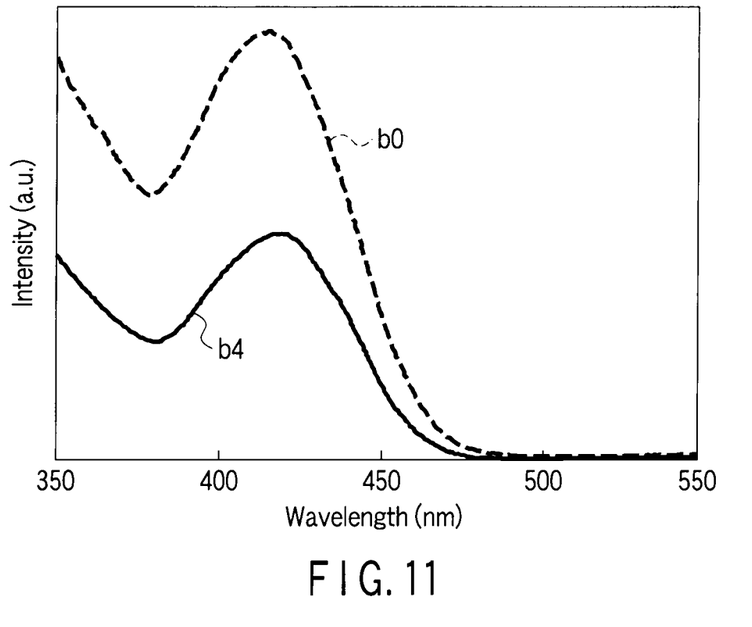
FIG. 11 is an excitation spectrum of a luminescent material of a Comparative Example.

The excitation spectrum of the luminescent material of Comparative Example 4 is shown as the curve b4 in FIG. 11. The excitation spectrum of the luminescent material of Comparative Example 1 is also shown as the curve b0 in FIG. 11. Further, the excitation spectra normalized by the excitation spectrum peak associated with the $^4A_2 \rightarrow ^4T_2$ transition as for Comparative Examples 1 and 4 are shown as the curves c0 and c4, respectively, in FIG. 12.

Figure 12:
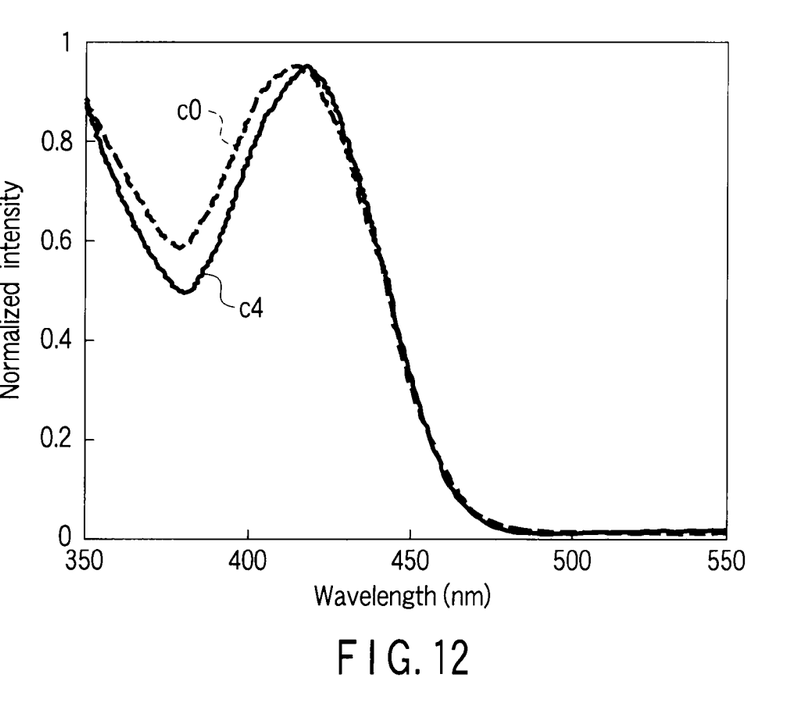
FIG. 12 is a normalized excitation spectrum.

As shown in FIG. 11, the excitation spectrum in the wavelength region of around 420 to 480 nm of the luminescent material having the composition of w=0 in Formula A becomes lower than that of the commercial luminescent material. Further, the normalized excitation spectrum in FIG. 12 shows that a long wavelength shift of a peak wavelength is not clearly confirmed.

A luminescent material of Comparative Example 5 was synthesized in the same manner as described in Example 1 except that $MgCl_2$ powder and $NH_4Cl$ as a crystal growth-promoting agent were not used. Cl is not added to the luminescent material of Comparative Example 5. Therefore, the luminescent material of Comparative Example 5 has the composition of d=0 in Formula A.

Figure 13:
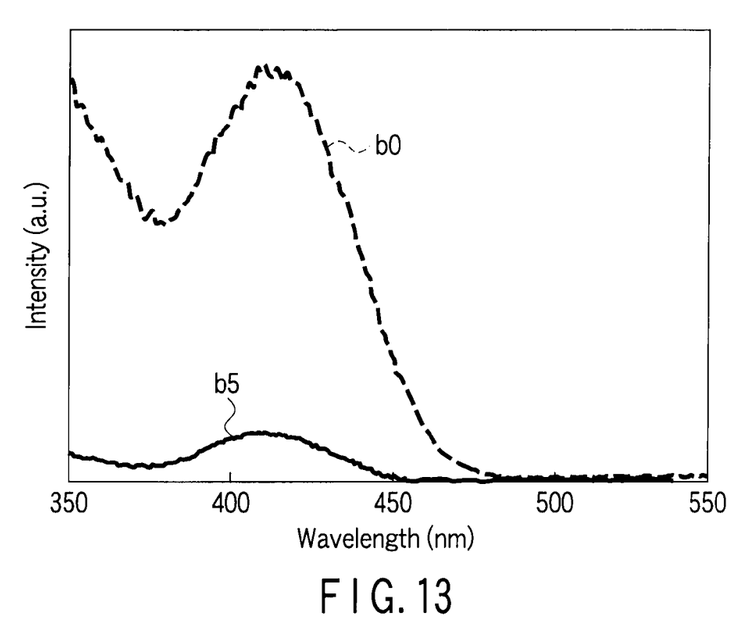
FIG. 13 is an excitation spectrum of a luminescent material of a Comparative Example.

The excitation spectrum of the luminescent material of Comparative Example 5 is shown as the curve b5 in FIG. 13. The excitation spectrum of the luminescent material of Comparative Example 1 is also shown as the curve b0 in FIG. 13. Further, the excitation spectra normalized by the excitation spectrum peak associated with the $^4A_2 \rightarrow ^4T_2$ transition as for Comparative Examples 1 and 5 are shown as the curves c0 and c5, respectively, in FIG. 14.

Figure 14:
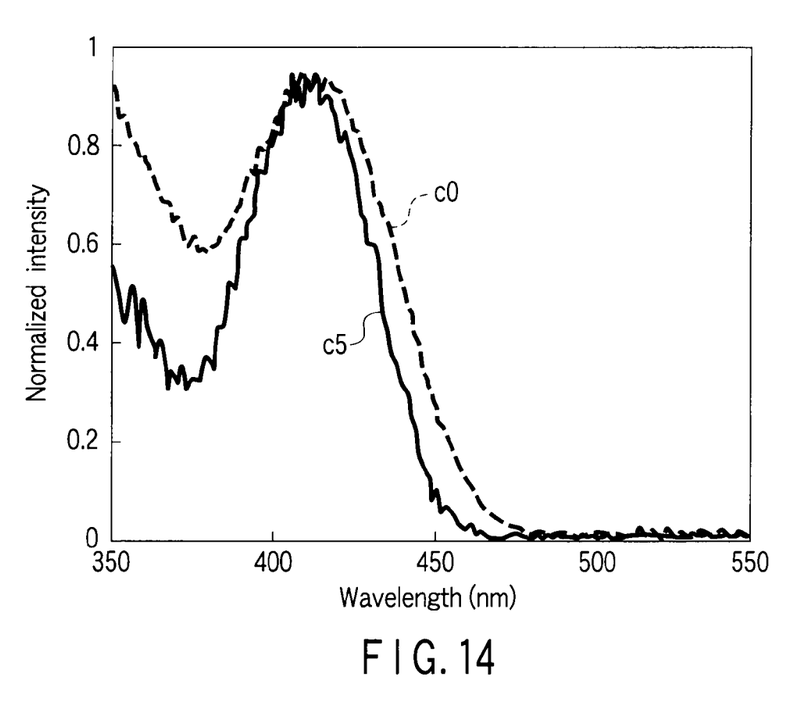
FIG. 14 is a normalized excitation spectrum.

As shown in FIG. 13, the excitation spectrum in the wavelength region of around 420 nm to around 480 nm of the luminescent material having the composition of d=0 in Formula A becomes lower than that of the commercial luminescent material. Further, the normalized excitation spectrum in FIG. 14 shows that a long wavelength shift of a peak wavelength is not clearly confirmed.

Thus, as for the luminescent materials of Comparative Examples 2 to 5, it was confirmed that the emissive intensity in the excitation wavelength region of around 420 to 480 nm is lower than that of the luminescent material of the commercial product (Comparative Example 1).

Then, a luminescent material of Example 2 was synthesized in the same manner as described in Example 1 except that 2.0 g of $CaCO_3$ powder were changed to 2.7 g of $SrCO_3$ powder. As a result of quantitative analysis thereof, it was confirmed that the composition of the luminescent material of Example 2 was $(Mg_{0.95},Sr_{0.05})_{4.3}(Ge_{0.90},Sn_{0.10})_{1.0}O_{6.9}, Cl_{0.35}:0.02Mn$.

Namely, a, b, c, d, w, x and z in Formula A are respectively as follows:
a=4.3, b=1.0, c=6.9, d=0.35,
w=0.05, x=0.1, z=0.02

Figure 15:
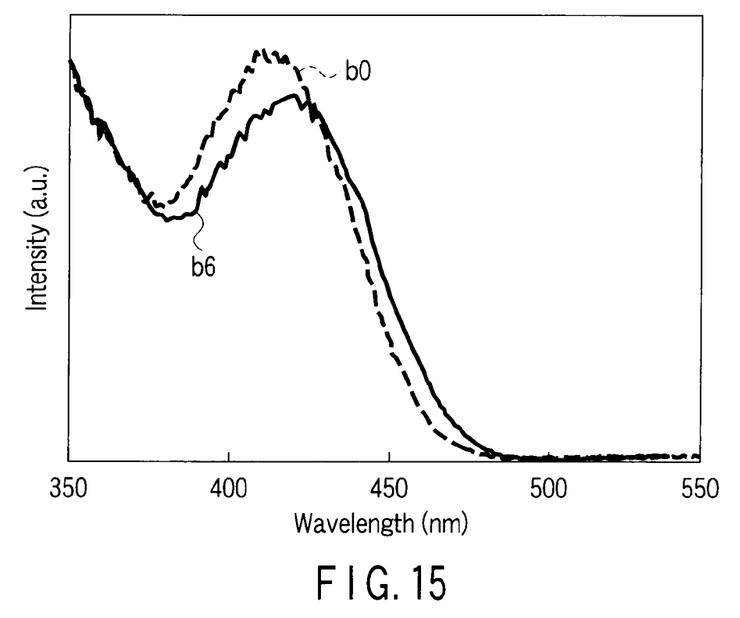
FIG. 15 is an excitation spectrum of a luminescent material according to another embodiment.
Figure 16:
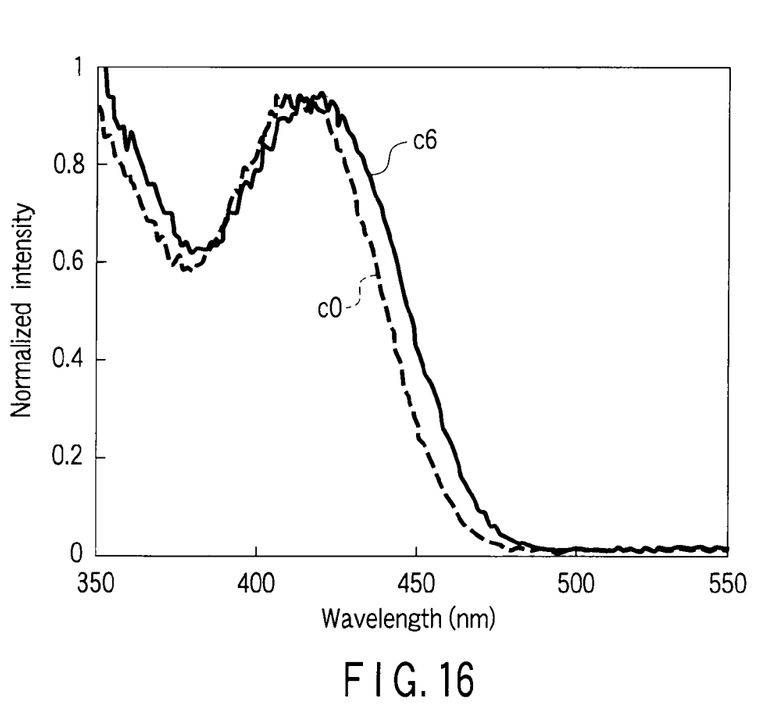
FIG. 16 is a normalized excitation spectrum.

The luminescent material of Example 2 was excited by the light in the ultraviolet to blue wavelength region to determine the excitation spectrum in the same manner as described above. The result is shown as the curve b6 in FIG. 15. The excitation spectrum of the luminescent material of Comparative Example 1 is also shown as the curve b0 in FIG. 15. Further, the excitation spectra normalized by the excitation spectrum peak associated with the $^4A_2 \rightarrow ^4T_2$ transition as for Comparative Example 1 and Example 2 are shown as the curves c0 and c6, respectively, in FIG. 16.

Although the intensity of the excitation spectrum of Example 2 is decreased, the peak of the excitation wavelength is shifted to a long wavelength. Therefore, in the excitation wavelength region of around 420 to 480 nm, a higher emissive intensity than that of the commercially available luminescent material ($3.5MgO.0.5MgF_2.GeO_2:Mn$) can be obtained.

Further, the content and the kind of AE of respective constituent elements were changed as shown in Table 1 below and the luminescent materials of Examples 3 to 8 were produced.

TABLE 1

| | Composition of the luminescent material | | | | | | | Kind |
|---|---|---|---|---|---|---|---|---|
| | a | b | c | d | w | x | z | of AE |
| Example 1 | 3.9 | 1.0 | 6.2 | 0.15 | 0.04 | 0.10 | 0.02 | Ca |
| Example 2 | 4.3 | 1.0 | 6.9 | 0.35 | 0.05 | 0.10 | 0.02 | Sr |
| Example 3 | 4.2 | 1.0 | 6.8 | 0.19 | 0.04 | 0.09 | 0.02 | Ca |
| Example 4 | 4.2 | 1.0 | 6.5 | 0.24 | 0.04 | 0.10 | 0.02 | Ca |
| Example 5 | 4.2 | 1.0 | 6.4 | 0.20 | 0.04 | 0.10 | 0.02 | Ca |
| Example 6 | 3.9 | 1.0 | 5.8 | 0.16 | 0.04 | 0.10 | 0.02 | Ca |
| Example 7 | 4.2 | 1.0 | 6.5 | 0.40 | 0.05 | 0.09 | 0.02 | Sr |
| Example 8 | 3.6 | 0.9 | 5.6 | 0.15 | 0.04 | 0.10 | 0.02 | Ca |

The obtained luminescent material was excited by the blue LED having a peak wavelength of 460 nm in the same manner as described above and the emissive intensity was determined. The intensity ratio calculated when the emissive intensity of the luminescent material of Comparative Example 1 is 1 is summarized in Table 2 below.

TABLE 2

| | Emissive intensity ratio |
|---|---|
| Example 1 | 1.35 |
| Example 2 | 1.16 |
| Example 3 | 1.42 |
| Example 4 | 1.24 |
| Example 5 | 1.25 |
| Example 6 | 1.33 |
| Example 7 | 1.05 |
| Example 8 | 1.32 |

Table 2 shows that the luminescent materials of Examples exhibit an emissive intensity higher than that of Comparative Example 1 since the luminescent materials of Examples have the composition represented by Formula A.

The luminescent materials of Examples 1 to 8 were excited by the blue LED having a peak wavelength of 460 nm and the emission spectrum was determined. As a result, the emission spectrum, configuration and peak wavelength of all of the luminescent materials were almost the same. The $^2E \rightarrow ^4A_2$ transition which is the emission transition of $Mn^{4+}$ added as an activator is quite insensitive to the crystal field as compared with the $^4A_2 \rightarrow ^4T_2$ transition of the excitation transition. Accordingly, it is assumed that the peak wavelength of the emission spectrum and the configuration are not changed when the luminescent material having the composition represented by Formula A is used. This is apparent from the Tanabe-Sugano diagram for a $d^3$ electron.

As explained with reference to FIG. 5, it was observed that the luminescent material of Example 1 showed a higher emissive intensity than that of the luminescent material of Comparative Example 1 when excited by the blue LED having a wavelength of 460 nm. This is assumed because the excitation spectrum in the region of around 380 to around 490 nm was shifted to the long wavelength side of the excitation spectrum associated with the $^4A_2 \to {}^4T_2$ transition, for example, as explained about the excitation spectrum (b1) of the luminescent material of Example 1 shown in FIG. 6.

The luminescent materials of Comparative Examples 2 to 5 were excited by the blue LED having a peak wavelength of 460 nm and the emissive intensity was determined. The emissive intensity ratio of each of the luminescent materials calculated when the emissive intensity of the luminescent material of Comparative Example 1 is 1 is summarized in Table 3 below.

TABLE 3

|  | Emissive intensity ratio |
|---|---|
| Comparative Example 1 | 1.00 |
| Comparative Example 2 | 0.23 |
| Comparative Example 3 | 0.28 |
| Comparative Example 4 | 0.56 |
| Comparative Example 5 | 0.08 |

As shown in Table 3 above, the emissive intensity of the luminescent materials of Comparative Examples 2 to 5 is inferior to the emissive intensity of Comparative Example 1.

As a yellow luminescent material, the commercially available luminescent material of $(Y,Gd)_3(Al,Ga)_5O_{12}$:Ce was prepared and dispersed in a silicone resin to prepare a raw material for the emissive layer. A white LED light-emitting device as shown in FIG. 1 was produced by combining the obtained raw material for the emissive layer with a flip-chip blue LED chip. The white LED light-emitting device is designated as Comparative Example 7.

Figure 17:
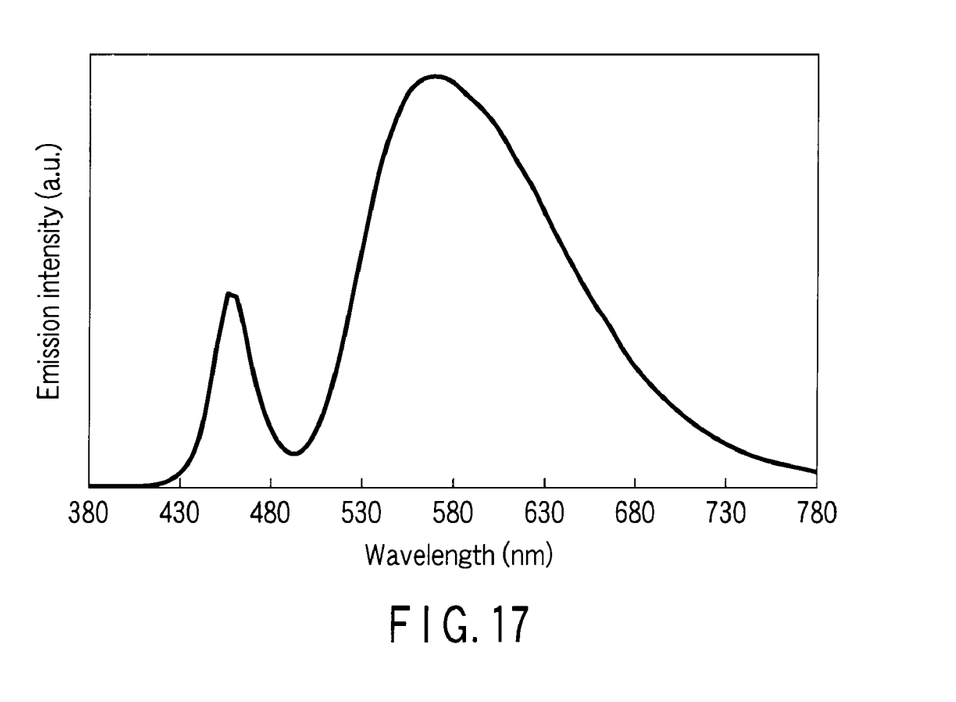
FIG. 17 is an emission spectrum of a light-emitting device of a Comparative Example.

For the purpose of adjusting the color temperature to 2800K, the content of the luminescent material in the raw material for the emissive layer was adjusted. However, the color temperature could not be adjusted to 2800K by only the commercially available luminescent material of $(Y,Gd)_3(Al,Ga)_5O_{12}$:Ce and a chromaticity point closest to 2800K was (x, y)=(0.430, 0.439). An average color rendering index Ra was 57 at this time. The emission spectrum of the light-emitting device is shown in FIG. 17. The average color rendering index Ra can be calculated from the emission spectrum of FIG. 17 obtained from the white LED light-emitting device.

Figure 18:
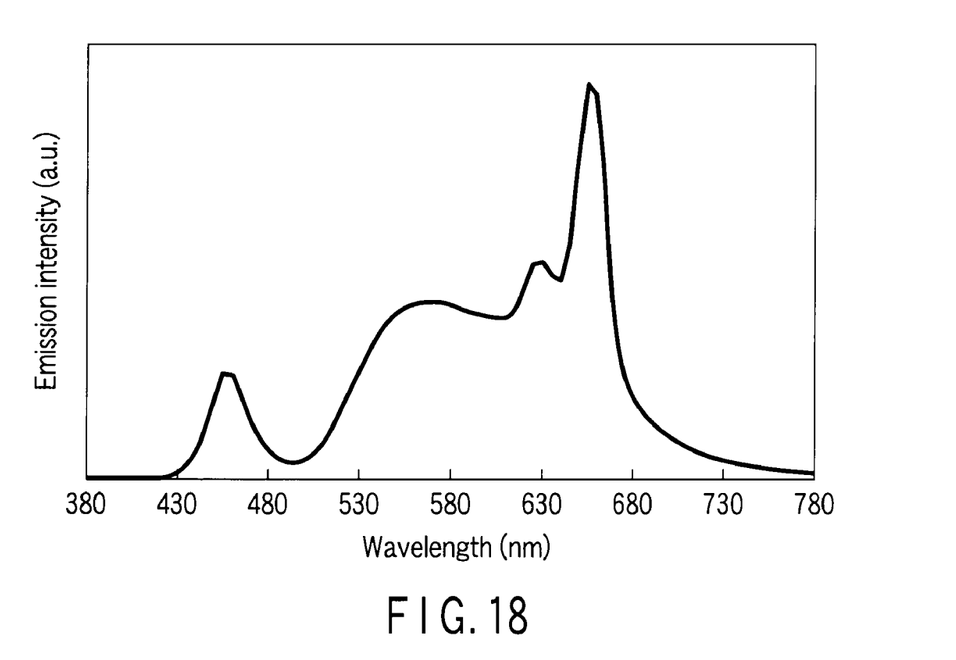
FIG. 18 is an emission spectrum of the light-emitting device according to one embodiment.

A resin mixture was prepared in the same manner as described in Comparative Example 7 except that the luminescent material of Example 1 was added. A white LED light-emitting device was produced in the same procedure as described above except that the obtained resin mixture was used. The white LED light-emitting device is designated as Example 9. The mixing ratio of the luminescent material in the resin composition was adjusted and the color temperature was adjusted to 2800K. The emission spectrum in this case is shown in FIG. 18. In the white LED light-emitting device where the color temperature was adjusted to 2800K, the average color rendering index Ra was 84. In Example 9, the chromaticity point of black body radiation of about 2800K was allowed to approach nearly (x, y)=(0.452, 0.409).

The luminescent material having the composition represented by Formula A was contained in the emissive layer. Thus, it was found that the color rendering of the white LED light-emitting device of Example 9 was further improved as compared with that of the white LED light-emitting device of Comparative Example 7 and the average color rendering index Ra was increased. Thus, the light-emitting devices of Examples are high in efficiency and in color rendering.

When the luminescent materials of Examples 2 to 8 were excited by the blue LED having a peak wavelength of 460 nm, almost the same emission spectrum as that of the luminescent material of Example 1 was obtained. It was confirmed that the white LED light-emitting devices formed by using the luminescent materials of Examples 2 to 8 exhibited almost the same emission spectrum as that of Example 9. Therefore, the light-emitting devices containing the luminescent materials of Examples 2 to 8 in the emissive layer showed a higher color rendering index than that of Comparative Example 7.

As shown in Table 2 above, the luminescent materials of Examples 1 to 8 excited by the blue LED having a peak wavelength of 460 nm exhibit an emissive intensity higher than that of the luminescent material of Comparative Example 1. It was confirmed that the white light-emitting device containing these luminescent materials in the emissive layer had an emissive efficiency higher than that of the light-emitting device of Comparative Example 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A luminescent material comprising:
luminescent material particles having a composition represented by formula A:

$$(Mg_{1-w},AE_w)_a(Ge_{1-x},Sn_x)_bO_c,Cl_d:zMn \qquad A$$

where AE is at least one selected from Ca and Sr, a, b, c, d, w, x and z respectively satisfies
$3.5 \leq a \leq 4.4$, $0.8 \leq b \leq 1.1$, $5.5 \leq c \leq 7.0$,
$0 < d \leq 0.41$, $0 < w \leq 0.05$, $0 < x \leq 0.10$, and
$0 < z \leq 0.03$.

2. The luminescent material according to claim 1, wherein $3.9 \leq a \leq 4.2$.

3. The luminescent material according to claim 1, wherein $0.9 \leq b \leq 1.0$.

4. The luminescent material according to claim 1, wherein $5.6 \leq c \leq 6.9$.

5. The luminescent material according to claim 1, wherein $0 < d \leq 0.40$.

6. The luminescent material according to claim 1, wherein w is 0.03 or more.

7. The luminescent material according to claim 1, wherein x is 0.08 or more.

8. The luminescent material according to claim 1, wherein AE is Ca, and $0 < d \leq 0.25$ and $0 < w \leq 0.04$.

9. The luminescent material according to claim 1, further comprising a surface layer formed on the luminescent material particles.

10. The luminescent material according to claim 9, wherein the surface layer is formed of an inorganic material.

11. The luminescent material according to claim 9, wherein the surface layer is formed of an organic material.

12. The luminescent material according to claim 1, wherein the luminescent material particles have an average particle diameter of 5 to 50 μm.

13. A light-emitting device comprising:
a light-emitting element which emits light having an emission peak at a wavelength ranging from 250 to 490 nm; and
an emissive layer containing a luminescent material which emits red light by receiving the light from the light-emitting element, at least part of the luminescent material which emits red light being the luminescent material of claim 1.

14. The light-emitting device according to claim 13, wherein the light-emitting element has an emission peak at a wavelength ranging from 380 to 490 nm.

15. The light-emitting device according to claim 14, wherein the light-emitting element has an emission peak at a wavelength ranging from 420 to 490 nm.

16. The light-emitting device according to claim 14, wherein the emissive layer further comprises a green or yellow luminescent material having a main emission peak in a wavelength region ranging from 500 to 580 nm.

17. The light-emitting device according to claim 16, wherein the green or yellow luminescent material is selected from the group consisting of silicate luminescent materials, aluminate luminescent materials, sulfide luminescent materials and alkaline earth oxynitride luminescent materials.

18. The light-emitting device according to claim 16, wherein the emissive layer further comprises at least one selected from the group consisting of a blue-green luminescent material and an orange luminescent material.

19. The light-emitting device according to claim 13, wherein the light-emitting element has an emission peak at a wavelength ranging from 380 to 440 nm.

20. The light-emitting device according to claim 18, wherein the emissive layer further comprises a blue luminescent material having a main emission peak in a wavelength region ranging from 440 to 500 nm.

* * * * *